(12) United States Patent
Abdo et al.

(10) Patent No.: US 6,806,007 B1
(45) Date of Patent: Oct. 19, 2004

(54) EUV MASK WHICH FACILITATES ELECTRO-STATIC CHUCKING

(75) Inventors: Amr Yehia Abdo, Madison, WI (US); Bruno LaFontaine, Pleasanton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/428,270

(22) Filed: May 2, 2003

(51) Int. Cl.$^7$ .............................................. G03F 9/00
(52) U.S. Cl. ............................................................ 430/5
(58) Field of Search ........................ 430/5; 378/34, 378/35

(56) References Cited

U.S. PATENT DOCUMENTS

| | | | |
|---|---|---|---|
| 5,962,174 A | * 10/1999 | Pierrat | ........................... 430/5 |
| 6,098,408 A | 8/2000 | Levinson et al. | |
| 6,178,221 B1 | 1/2001 | Levinson et al. | |
| 6,356,340 B1 | 3/2002 | Spence | |

OTHER PUBLICATIONS

"Application of Reactive Ion Etching to the Fabrication of Microstructure on Mo/Si Multilayer", Le Zi–Chun, L. Dreeskornfeld, S. Rahn, R. Segler, U. Kleineberg and U. Heinzmann, Chin. Phys. Lett., vol. 16, No. 9, 1999, pp. 665–666.

"Soft X–Ray Projection Imaging with Multilayer Reflection Masks", Masaaki Ito, Hiroaki Oizumi, Takashi Soga, Hiromasa Yamanashi, Taro Ogawa, Soichi Katagiri, Eiichi Seya and Eiji Takeda. Elsevier Science B.V.. Mciroelectronic Engineering 27, 1995, pp. 285–290.

"Reactive Ion Etching of Multilayer Mirrors for X–Ray projection Lithography Masks", C. Khan Malek, F. R. Ladan, M. Carre and R. Rivoira, Elsevier Science Publishers B.V., Microelectronic Engineering 13, 1991, pp. 283–286.

"Application of E–Beam Lithography and Reactive Ion Etching to the Fabrication of Masks for Projection X–Ray Lithography", C. Khan Malek, F.R. Ladan, R. Rivoira, and T. Moreno, American Vacuum Society, Nov./Dec., 1991, pp. 3315–3318.

"Reflective Mask Technologies and Imaging Results in Soft X–Ray Projection Lithography", D.M. Tennant, J.E. Bjorkholm, R.M. D'Souza, L. Eichner, R.R. Freeman. J.Z. Pastalan. L.H. Szeto. O.R. Wood II. T.E. Jewell. W.M. Mansfield, W.K. Waskiewiza, D.L. White, D.L. Windt and A.A. MacDowell, American Vacuum Society, Nov./Dec., 1991, pp. 3176–3183.

* cited by examiner

Primary Examiner—Saleha R. Mohamedulla
(74) Attorney, Agent, or Firm—Eschweiler & Associates, LLC

(57) ABSTRACT

A lithography mask or reticle and method of making the same is disclosed wherein the fidelity of pattern transfers is enhanced by way of a reduction in the opportunity for contaminating particles to become wedged between the mask and a chuck upon which the mask may rest during semiconductor processing via electrostatic chucking, and also by facilitating heat dissipation within the mask via thermal conductance to mitigate warping of the mask. One or more thermally conductive pads formed within one or more layers applied to the mask facilitate the thermal conductance, and spaces or apertures formed within the layers reduce the potential for particle contamination.

26 Claims, 14 Drawing Sheets

US 6,806,007 B1

EUV MASK WHICH FACILITATES ELECTRO-STATIC CHUCKING

FIELD OF INVENTION

The present invention relates generally to a reflective mask for use in lithography, such as extreme ultra-violet lithography, and to a methodology for making the same.

BACKGROUND OF THE INVENTION

In the semiconductor industry, there is a continuing trend toward higher device densities. To achieve these high densities there has been, and continues to be, efforts toward scaling down the device dimensions on semiconductor wafers. In order to accomplish such a high device packing density, smaller feature sizes are required. This may include the width and spacing of interconnecting lines and the surface geometry such as the corners and edges of various features.

The requirement of small features with close spacing between adjacent features requires high resolution photo-lithographic processes. In general, lithography refers to processes for pattern transfer between various media. With regard to semiconductor fabrication, a silicon slice (e.g., a wafer) is coated uniformly with a radiation-sensitive film (e.g., a resist). The coated substrate can be baked to evaporate solvents in the resist composition and to fix the resist coating onto the substrate. An exposing source (e.g., light, x-rays, an electron beam) can then be utilized to illuminate selected areas of the surface of the film through an intervening master template (e.g., a mask or reticle) to affect the transfer of a pattern formed within the template onto the wafer. The lithographic coating is generally a radiation-sensitized coating suitable for receiving a projected image of the subject pattern. Once the image from the intervening master template is projected onto the resist coating, it is indelibly formed therein.

Light projected onto the resist layer during photolithography changes properties (e.g., solubility) of the layer of material such that different portions thereof (e.g., the illuminated or un-illuminated portions, depending upon the type of resist utilized) can be manipulated in subsequent processing steps. For example, regions of a negative resist become insoluble when illuminated by an exposure source such that the application of a solvent to the resist during a subsequent development stage removes only non-illuminated regions of the resist. The pattern formed in the negative resist layer is, thus, the negative of the pattern defined by opaque regions of the template. By contrast, in a positive resist, illuminated regions of the resist become soluble and are removed via application of a solvent during development. Thus, the pattern formed in the positive resist is a positive image of opaque regions on the template.

By way of example, prior art FIGS. 1–6 generally depict the fundamental operation of positive and negative type resists in a photolithography process. A cross-sectional side view of a portion of one or more layers of a wafer 100 whereon semiconductor structures are produced is illustrated in the figures to facilitate the explanation. In FIG. 1, a resist layer 102 is deposited on a thin film 104, such as via spin-coating, for example. The thin film 104 may include, for example, silicon dioxide ($SiO_2$) and overlies a substrate 106 that can comprise silicon, for example. In FIG. 2, the resist layer 102 is selectively exposed to radiation 108 (e.g., ultraviolet (UV) light) via apertures 110 formed within a mask or reticle 112 to generate one or more exposed regions 114 in the resist layer 102.

When the exposed regions 114 are made soluble, a positive image of the mask 112 is produced in the resist layer 102. These features 114 are revealed when a specific solvent or developer is subsequently applied across the wafer 100 as illustrated in FIG. 3.

In this situation, the resist material is therefore referred to as a "positive resist". Areas 116 of the film 104 underlying the removed regions 114 of the resist layer 102 may then be subjected to further processing (e.g., etching) to thereby transfer the desired pattern from the mask 112 to the film 104, as illustrated in FIG. 4 (wherein the remaining portions of the resist layer 102 has been stripped away or otherwise removed).

Conversely, when the exposed regions 114 are made insoluble by radiation, a negative image of the mask 112 is produced in the resist layer 102. These features 114 remain when the rest of the resist layer 102 is removed via application of a specific solvent or developer across the wafer 100, as is illustrated in FIG. 5. In this situation the resist material is referred to as a "negative resist." Revealed areas 118 in the film 104 may then be subjected to further processing (e.g., etching) to thereby transfer into the film 104 the desired features 120 from the mask 112, as illustrated in FIG. 6 (wherein the remaining portions of the resist layer 102 have once again been stripped away or otherwise removed).

Projection lithography is a powerful and important tool for integrated circuit processing. However, as feature sizes continue to decrease, optical systems are approaching their limits due to the wavelengths of the optical radiation utilized. A recognized way of further reducing feature sizes is to lithographically image them with radiation of a shorter wavelength. Extreme ultraviolet (EUV) or "soft" x-rays, which have wavelengths within a range of about 30 to 700 Angstroms (i.e., about 3 to 70 nm), can, for example, be considered as an alternative radiation source in photolithography processing in an effort to achieve smaller desired feature sizes.

Prior art FIG. 7 is a schematic diagram illustrating the fundamentals of an exemplary EUV lithography system 700. The prior art system 700 depicted in FIG. 1 is designed to delineate a latent image (not shown) of a desired circuit pattern (e.g., having feature dimensions of 0.13 $\mu$m and less) onto a wafer 702, and more particularly onto one or more die on the wafer 702, by illuminating a reflective mask 704 with EUV radiation and having at least a portion of that radiation reflected onto the wafer (e.g. via a system of mirrors). The portion of the radiation reflected onto the wafer 702 corresponds to the desired circuit pattern that is to be transferred onto the wafer 702. It will be appreciated that FIG. 7 is a simplified schematic representation of such a system wherein certain components are not specifically shown.

By way of example, EUV radiation 706 having a wavelength of between about 3 nm to 70 nm, for example, can be generated from a light source 708, such as a synchrotron or a laser plasma source that can include optical filtering elements 710 and a reflective condenser 712. The condenser and filtering elements can collect the EUV radiation and project one or more beams 714 onto the reflective mask 704 through a slit (not shown), for example, having a particular width and length. The reflective mask 704 absorbs some of the EUV radiation 716 and reflects other portions of the EUV radiation 718 corresponding to one or more features or circuit patterns formed on the mask. The reflective system can include, for example, a series of high precision mirrors 720 (e.g., concave and/or convex mirrors) which can cause the radiation to converge and/or diverge in projecting a de-magnified or reduced image of the pattern(s) to be transferred onto the wafer 702, which is coated with a resist material. Typically, the reflective mask 704 and wafer 702 are mounted to stages (not shown) such that a scanner can move the mask 704 and the wafer 702 at respective orientations and speeds relative to one another (e.g., in a step and scan fashion) to effect a desired mask-to-image reduction and to facilitate pattern transfers onto one or more different die on the wafer.

The mask 704 of prior art FIG. 7 is an important component in the EUV lithography system 700. Unlike conventional UV lithography systems which predominately use refractive optics, many EUV lithography systems, such as the system 700 depicted in prior art FIG. 7, utilize reflective optics. The mask 704 is thus a reflective mask that reflects at least some incident EUV radiation to transfer a pattern onto a wafer during a semiconductor fabrication process, as opposed to allowing some of the radiation to pass through selected portions of the mask.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its purpose is merely to present one or more concepts of the invention in a simplified form as a prelude to the more detailed description that is presented later.

The present invention pertains to a lithography mask or reticle and method of making the same that enhances the fidelity of pattern transfers by reducing the opportunity for contaminating particles to become wedged between the mask and a chuck upon which the mask may rest during semiconductor processing via, for example, electrostatic chucking, and also by facilitating heat dissipation via thermal conductance to mitigate warping of the mask. One or more thermally conductive pads formed within one or more layers applied to the mask facilitate the thermal conductance, and spaces or apertures formed within the layers between the pads mitigate particle contamination.

According to one or more aspects of the present invention, a method of making a reflective lithography mask includes forming a first layer of thermally conductive material over a backside of a substrate of the reflective mask, wherein one or more features to be transferred onto a wafer are formed within one or more layers formed over a topside of the substrate. A second layer of thermally conductive material is then formed over the first layer of thermally conductive material, and one or more thermally conductive pads are then formed within the second layer of thermally conductive material.

According to one or more other aspects of the present invention, a method of making a reflective lithography mask includes forming one or more layers of a thermally conductive material over a backside of a substrate of the reflective mask, wherein one or more features to be transferred onto a wafer are formed within one or more layers formed over a topside of the substrate, and forming one or more thermally conductive pads within at least one of the layers of thermally conductive material.

In accordance with one or more other aspects of the present invention, a method of making a reflective lithography mask includes forming one or more thermally conductive pads within a backside of a substrate of the reflective mask, wherein one or more features to be transferred onto a wafer are formed within one or more layers formed over a topside of the substrate. The one or more pads facilitate conducting heat away from the mask to mitigate distortion of the mask, and the pads are defined by one or more apertures formed within the backside of the substrate. The apertures mitigate the opportunity for contaminating particles to become lodged between the mask and a flat chuck upon which the mask can rest.

According to one or more other aspects of the present invention, a reflective lithography mask includes one or more layers of a thermally conductive material formed over a backside of a substrate of the reflective mask, wherein one or more features to be transferred onto a wafer are formed within one or more layers formed over a topside of the substrate. The mask also includes one or more thermally conductive pads formed within at least one of the layers of thermally conductive material.

In accordance with yet one or more other aspects of the present invention, a reflective lithography mask includes a substrate, wherein one or more features to be transferred onto a wafer are formed within one or more layers formed over a topside of the substrate. The mask further includes one or more thermally conductive pads formed within a backside of the substrate, wherein the one or more pads facilitate conducting heat away from the mask to mitigate warping of the mask. The pads are defined by one or more apertures formed within the backside of the substrate, and the apertures mitigate the opportunity for contaminating particles to become lodged between the mask and a flat chuck upon which the mask can rest.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
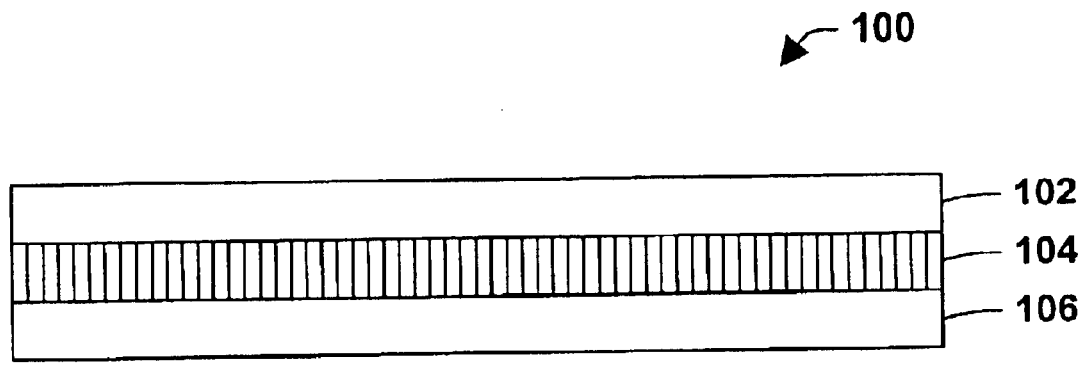
FIG. 1 is a cross-sectional side view of at least a portion of a wafer whereon one or more features of a semiconductor device may be formed via a photolithographic process.
Figure 2:
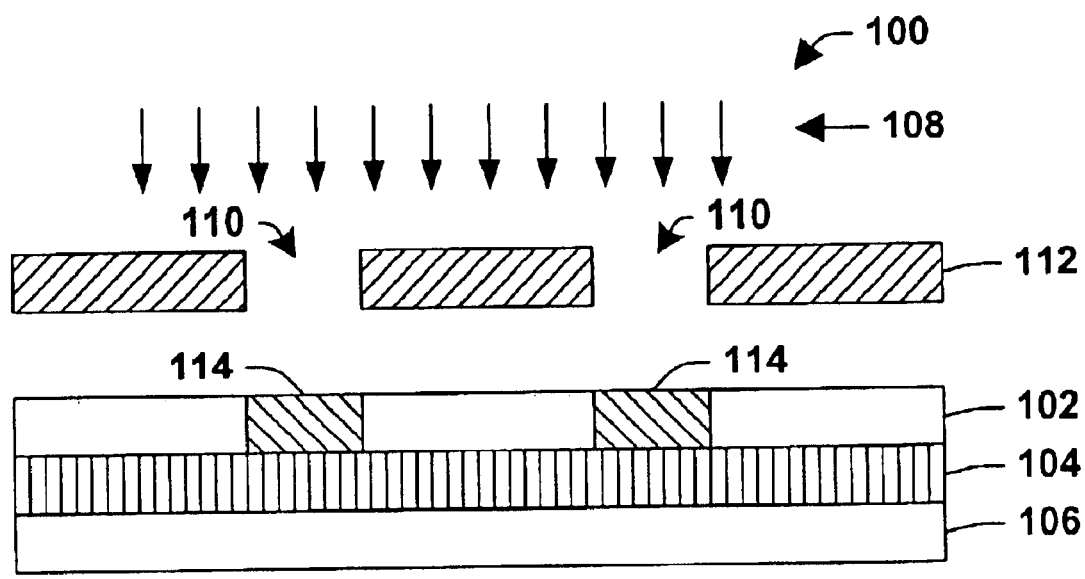
FIGS. 2–4 are cross-sectional side views of the wafer of FIG. 1 along with a photolithography mask demonstrating principles of a positive resist in a photolithographic process.
Figure 3:
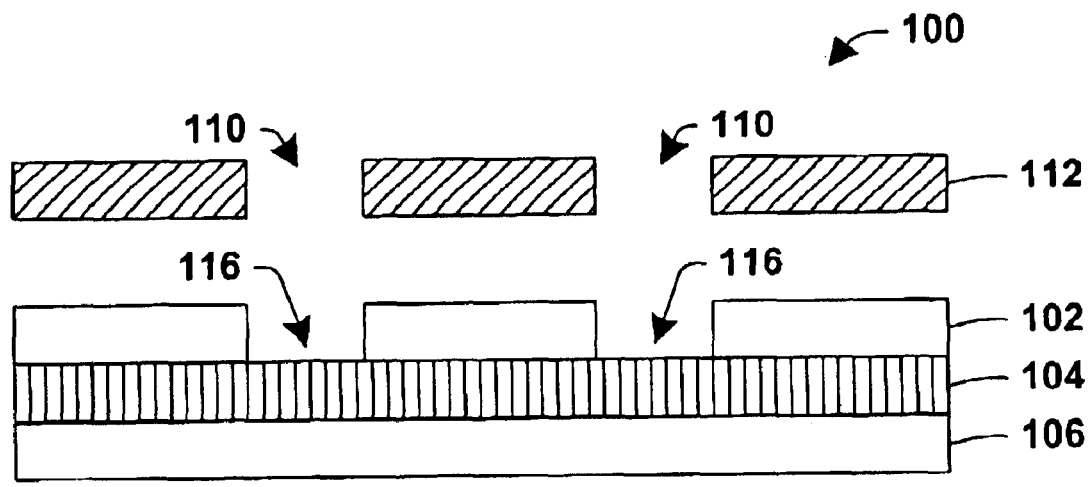
Figure 4:
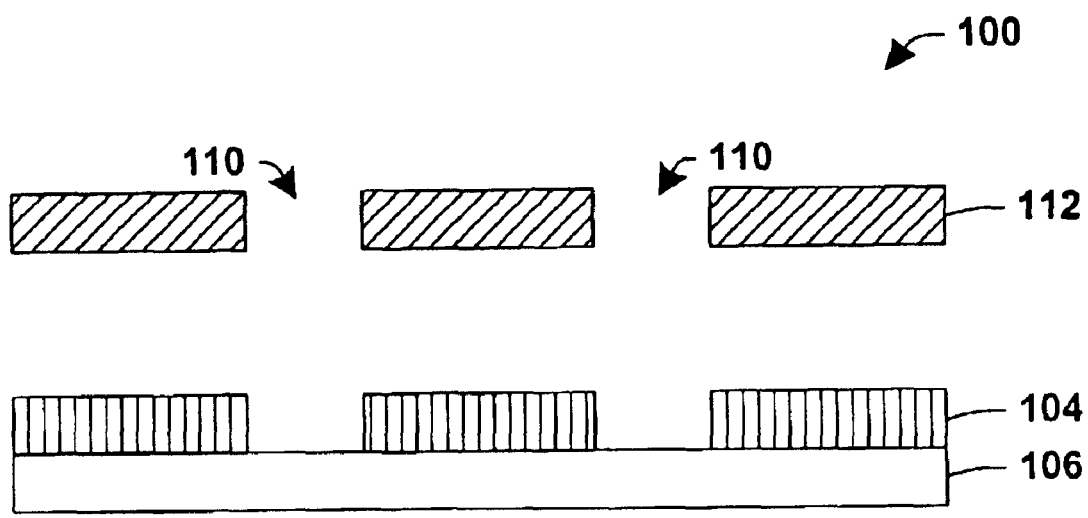
Figure 5:
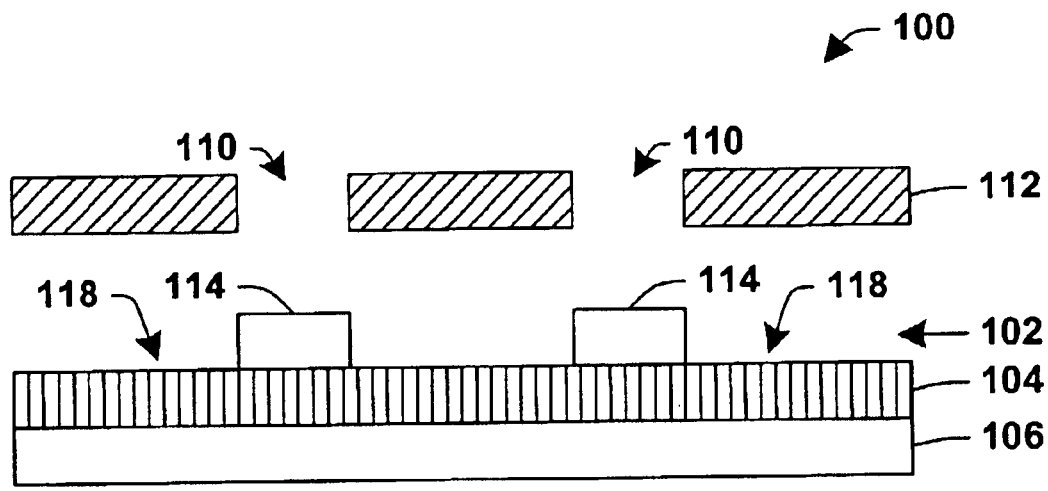
FIGS. 5 and 6 are cross-sectional side views of the wafer of FIG. 1 along with a photolithography mask demonstrating principles of a negative resist in a photolithographic process.
Figure 6:
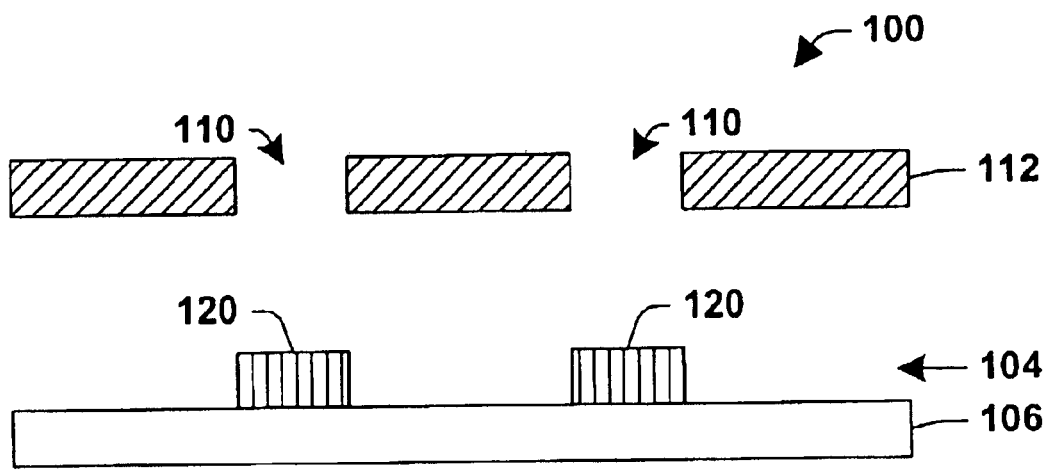

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, that one or more aspects of the present invention may be practiced with a lesser degree of these specific details. In other instances, well-known structures and devices are shown in block diagram form in order to facilitate describing one or more aspects of the present invention.

The present invention pertains to a lithography mask or reticle and method of making the same that enhances the fidelity of pattern transfers by reducing the opportunity for contaminating particles to become wedged between the mask and a chuck upon which the mask may rest during semiconductor processing via electrostatic chucking, and also by facilitating heat dissipation via thermal conductance to mitigate warping of the mask. One or more thermally conductive pads formed within one or more layers applied to the mask facilitate the thermal conductance, and spaces or apertures formed within the layers between the pads mitigate particle contamination.

In the examples described below, one or more EUV reflective mask and respective formation(s) thereof are discussed and illustrated. It is to be appreciated, however, that the present invention is equally applicable to reflective masks employed over a broad range of wavelengths, and that all such reflective mask structures and methods associated therewith are contemplated as falling within the scope of the present invention. Additionally, the term substrate is used herein, and that term is intended to include, inter alia, a low-thermal-expansion-material (LTEM) and any other layers formed thereover or associated therewith. It is to be further appreciated that the elements depicted and described herein in association with the accompanying figures and drawings are depicted with particular dimensions relative to one another (e.g., layer to layer dimensions and/or orientations) for demonstrative purposes and simplicity and ease of understanding, and that the actual dimensions of the elements may differ substantially from that shown and described herein. It is to be still further appreciated that one or more of the layers or formations shown and described herein can be formed in any suitable number of ways, either alone or in combination, such as with spin-on techniques, sputtering techniques (e.g., magnetron or ion beam sputtering), growth and/or deposition techniques (e.g., chemical vapor deposition (CVD), atomic layer deposition (ALD)) and/or etching, for example.

Figure 8:
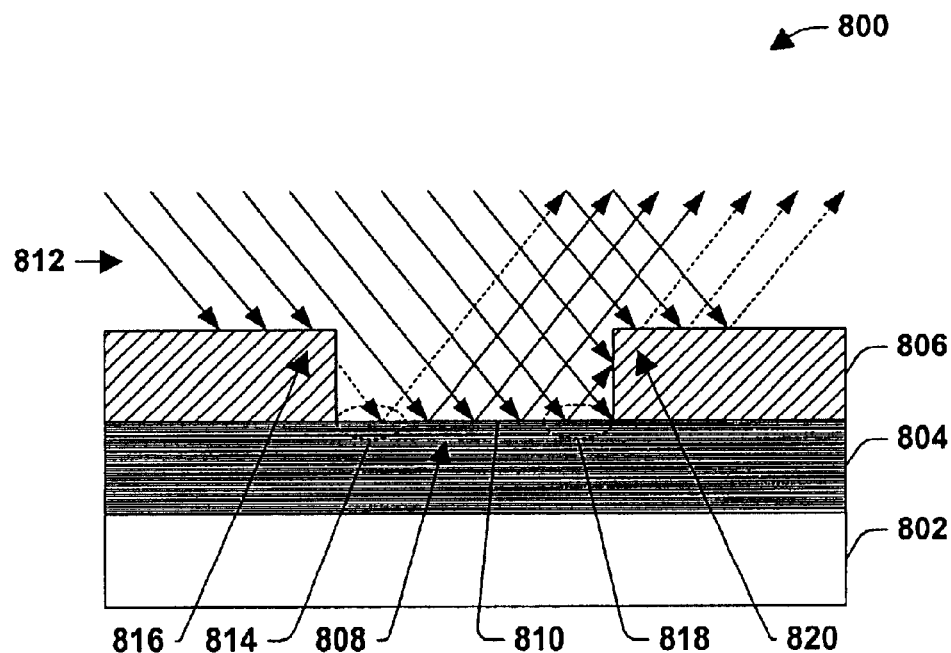
FIG. 8 is a cross-sectional side view of at least a portion of an exemplary EUV reflective mask.

FIG. 8 is a cross-sectional view of one or more layers that comprise at least a portion of an exemplary extreme ultraviolet (EUV) reflective mask 800 suitable to accommodate one or more aspects of the present invention. A substrate 802 is included as a base of the mask 800, and a reflective coating 804 overlies the substrate 802. An absorbing coating 806 overlies the reflective coating 804 and is patterned so as to correspond to a desired feature that is to be transferred/reflected onto a wafer (not shown). In the illustrated example, a single feature 808 is depicted and is defined by an aperture in the absorbing coating 806 which exposes a potion 810 of the reflective coating 804. It is to be appreciated, however, that this representation is exemplary only, and that reflective masks 800 can be patterned in any suitable fashion(s) to include any number of features having any types of shapes, sizes and/or dimensions.

By way of example, the substrate 802 generally comprises a low-thermal expansion material (LTEiM), such as a mixed glass composition of about 92.6 wt. % $SiO_2$ and about 7.4 wt. % $TiO_2$, for example. The reflective coating 804 includes a material that is substantially reflective to extreme ultraviolet (EUV) radiation, and can include, for example, a plurality of overlapping reflective materials (e.g., 40–60 bi-layers) to enhance the EUV reflectivity of the coating. By way of example, layers of any one or more of the following, either alone or in combination, can be utilized to reflect EUV radiation, for example, silicon, molybdenum, beryllium, ruthenium and boron carbide. By way of further example, the reflective coating may include eighty (80) layers of alternating molybdenum and silicon, the respective layers having a thickness within a range of about 1–10 nm. The absorbing coating 806 includes a material that is substantially absorbent to EUV radiation. The absorbing material can include, for example, any one or more of the following, either alone or in combination: chrome, fused silica ($SiO_2$), silver, tungsten, gold, germanium, tungsten, tantalum, tantalum nitride, titanium and/or titanium nitride.

Figure 7:
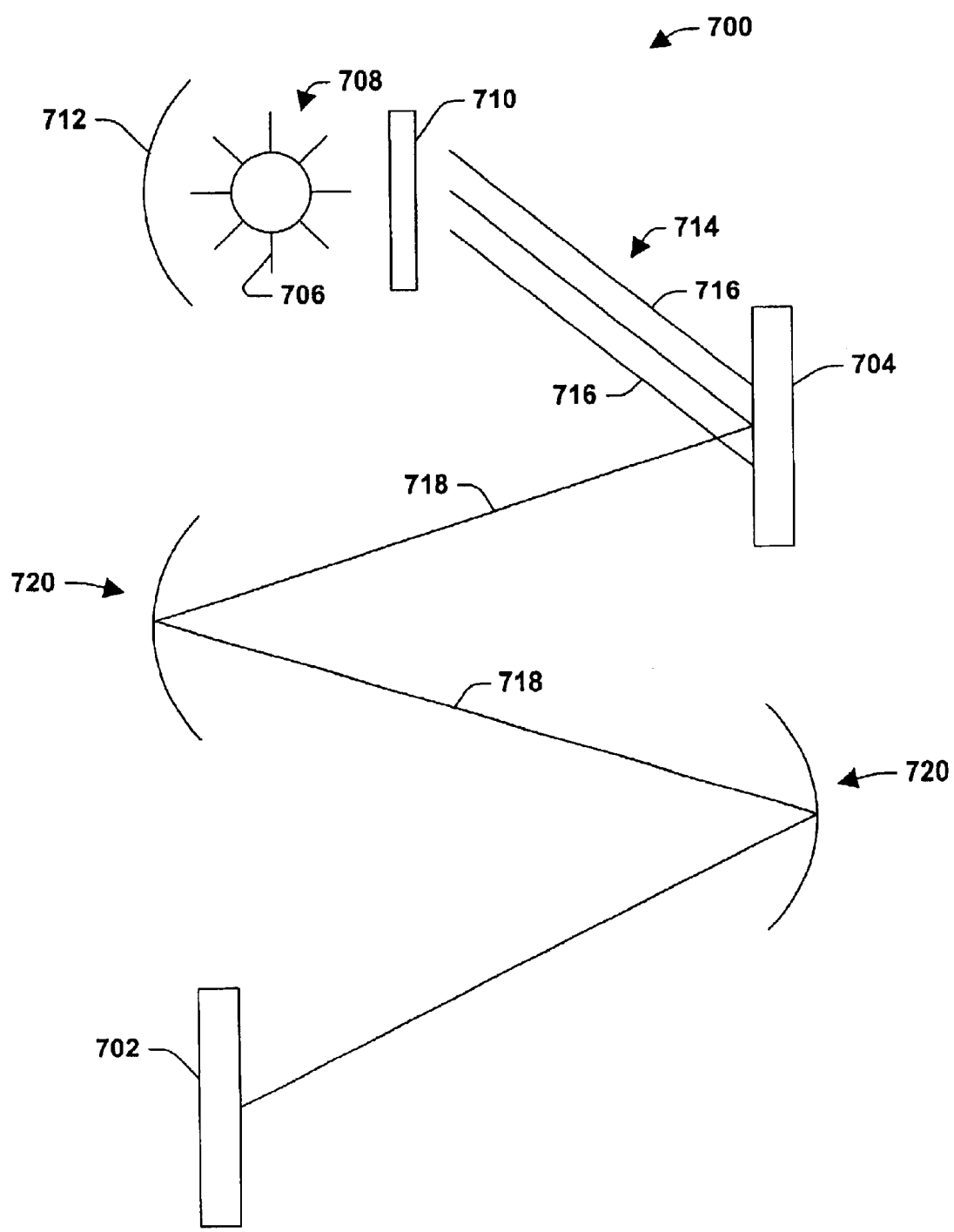
FIG. 7 is a schematic view of a conventional extreme ultraviolet (EUV) reflective lithography system.

EUV radiation 812 directed at the mask 800 is thus reflected by the exposed portion 810 of the reflective layer 804 and is absorbed by un-patterned portions of the absorbing layer 806. The reflected EUV radiation thus corresponds to a desired circuit pattern and facilitates transferring the pattern onto an associated wafer (e.g., by interacting with an EUV sensitive coating formed on the wafer). However, because the EUV light 812 is generally incident to the mask at an angle that is off-normal (as depicted in FIG. 7), the entirety of the exposed portion(s) 810 of the reflective layer 804 may not receive EUV radiation 812. For example, an area 814 (encircled in phantom) may be "shadowed" by the surrounding absorbing material 816. The size of this area 814 is a function of the angle of incidence of the EUV radiation 214 as well as the dimensions (e.g., height) and configuration (e.g., a sharp corner) of the surrounding absorbing material 816. The greater the angle of incidence, and the more surrounding material 816 there is, the larger this area 814 may be. If EUV radiation does not reach this area 814, it will not be reflected thereby, and circuit features corresponding to this area will not be transferred onto associated wafers during semiconductor fabrication. The accuracy of pattern transfers may thereby be compromised, and resulting semiconductor devices may perform in manners other than as desired. It will be appreciated that, for purposes of illustration, the path of light that would otherwise pass through the surrounding material 816 and be reflected by the exposed portion 810 of the reflective layer 804 is depicted in phantom in FIG. 7.

Additionally, other areas of the exposed portions 810 of the reflective layer 804 may also be deficient with regard to providing radiation to associated wafers during semiconductor fabrication processes. However, these areas do not fail to convey EUV radiation because they never receive the radiation (e.g., as with area 814 which experiences shadowing effects), but because the EUV radiation that they receive (and subsequently reflect) may be blocked by surrounding absorbing material. For example, a second area 818 (encircled in phantom) of the exposed portion 810 of the reflective material 804 receives incident EUV radiation and reflects the radiation. However, the reflected EUV radiation may be absorbed by adjacent absorbing material 820 and therefore may not escape the mask 800. For purposes of illustration, the path of reflected radiation that would otherwise pass through surrounding material 820 is depicted in phantom. The size of this area 818 is thus a function of the angle of incidence (which usually equals the angle of reflection as the reflective layer is generally smooth and uniform) as well as the dimensions (e.g., height) and configuration (e.g., a sharp corner) of the surrounding material 820. The greater the angle of incidence (and thus the angle of reflection), and the more surrounding absorbing material 820 there is, the larger the area 818 may be.

The respective sizes of these unproductive areas or dead zones 814, 818 are usually relatively equal as the angle of incidence typically remains constant across the smooth exposed portion 810 of the reflective layer 804 and the dimensions and configurations of the surrounding absorbing material 816, 820 are also generally equal. Regardless of their symmetry, asymmetry and/or dimensions, however, the effects of these areas 814, 818 can mitigate and interfere with the success of pattern transfers as the entirety of features are not reflected onto associated wafers, either by not receiving and therefore not reflecting all of the incident radiation (e.g., as with area 814) or by receiving and reflecting the EUV radiation, but then having some of that radiation blocked by surrounding absorbing material (e.g., as with area 818).

Figure 9:
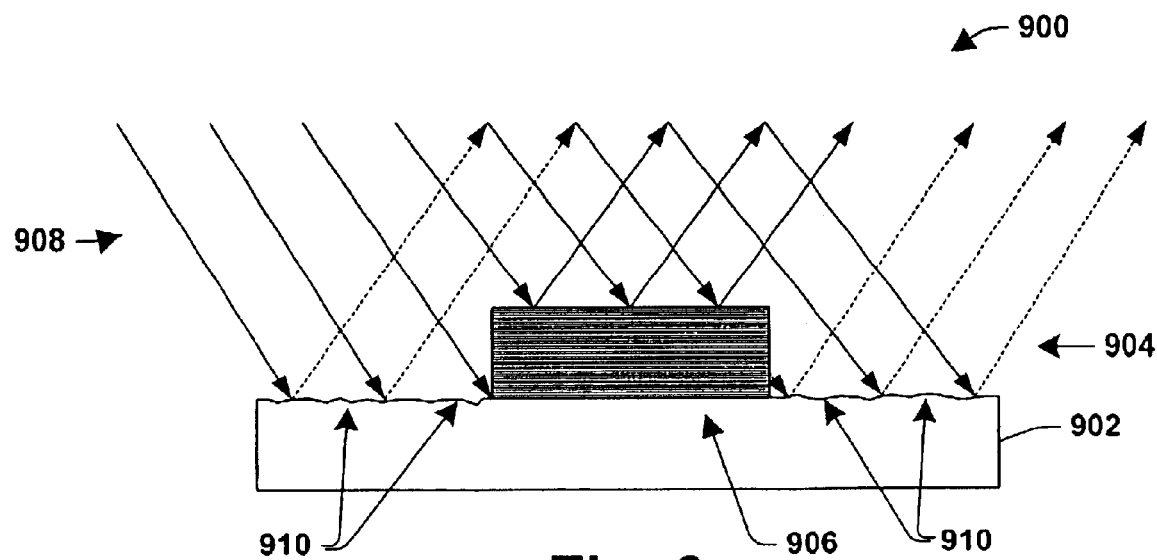
FIG. 9 is a cross-sectional side view of at least a portion of another exemplary EUV reflective mask.

FIG. 9 illustrates a cross-sectional view of one or more layers comprised within at least a portion of an exemplary extreme ultraviolet (EUV) reflective mask 900 similar to that depicted in FIG. 8, but which is designed to mitigate some of the aforementioned shadowing issues associated with such a mask. A substrate 902 within the mask 900 is overlaid with a reflective coating 904 that has been patterned to include a feature 906 that is to be transferred onto a wafer. The substrate 902 is substantially absorbent to EUV radiation 908, and the reflective coating 904 is substantially reflective to EUV radiation 908.

In the example shown, the substrate 902 has been processed (e.g., etched slightly) so as to have a roughened surface 910 to increase the absorptivity of the substrate 902 with regard to EUV radiation. When EUV radiation is directed at the mask 900, the entirety of the feature 906 receives radiation and the entirety of the feature is thus reflected onto a wafer. Since the feature 906 is formed within the reflective coating 904, rather than as an aperture or a negative of the feature within an absorbing coating overlying the reflective coating (e.g., as in the mask 800 depicted in FIG. 8), the adverse effects of surrounding material are mitigated and the fidelity of pattern transfers is enhanced. Such a mask 900 is suitable to accommodate one or more aspects of the present invention.

By way of example, the substrate 902 can be made of any suitable material, but generally includes a material that has a low coefficient of thermal expansion (e.g., between about 5 ppb/° C. and 30 ppb/°C.). The substrate can also be polished to have a substantial uniformity and flatness to facilitate a flush interface between the substrate 902 and other layers, such as the reflective coating 904. Exposed portions of the substrate can then be processed to form roughened surfaces 910 to increase the absorptivity of the substrate 902. The substrate can include, for example, a low-thermal expansion material, such as ULE™, or Zeroduor™, or a mixed glass composition of 92.6 wt. % $SiO_2$ 7.4 wt. % $TiO_2$.

The reflective coating 904 can similarly comprise any suitable material, but generally includes a plurality of overlapping reflective materials (e.g., 40–60 bi-layers). The plurality of layers enhances the EUV reflectivity of the coating. By way of example, layers of any one or more of the following, either alone or in combination, can be utilized to comprise the EUV reflective coating 904: silicon, molybdenum, beryllium, ruthenium and boron carbide. Layers of such materials can be utilized to construct a reflective coating that reflects EUV radiation having wavelengths between about 3–70 nm, for example.

By way of further example, the reflective coating 904 may include eighty (80) layers of alternating molybdenum and silicon, where respective layers have thicknesses within a range of about 1–10 nm. The respective layers of reflective material can also have a layer-to-layer thickness variation that is generally maintained within a relatively small range, such as 0.005–0.015 nm, for example. The layers can also be substantially smooth, uniform and defect free, and the transition between the layers can be relatively abrupt. Such characteristics facilitate desired optical performance with the reflective layer and help to establish a high-throughput, cost-effective lithography system (e.g., having an EUV reflection efficiency of about 65% or more). Although the mask 900 of FIG. 9 may exhibit some performance advantages over the mask 800 of FIG. 8, it should be understood that the present invention may be employed in conjunction with either mask or other types of masks, and such variations are contemplated by the present invention.

Figure 10:
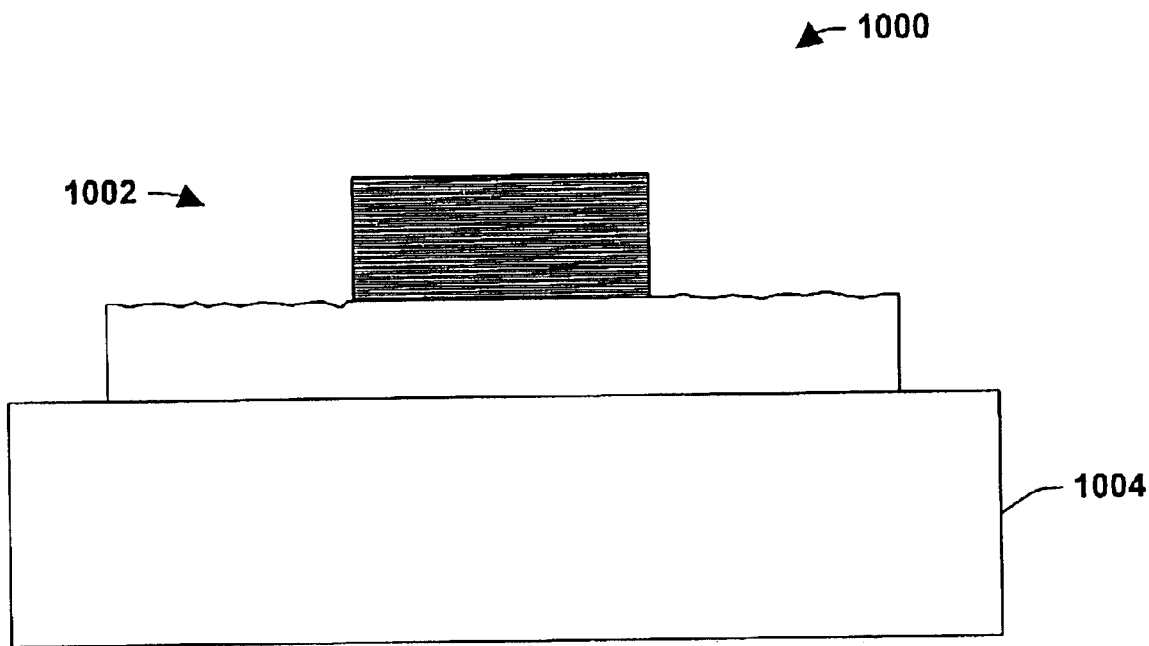
FIG. 10 is a cross-sectional side view of at least a portion of an EUV reflective mask situated within an electrostatic chucking arrangement.

It will be appreciated that EUV reflective masks can be held in place during semiconductor fabrication processing in a number of ways, such as via electrostatic or pin chucking techniques. Turning to FIG. 10, an electrostatic chucking arrangement 1000 is depicted in cross-sectional view, wherein at least a portion of an EUV reflective mask 1002, such as that depicted in FIG. 9, is situated on a flat chuck 1004. While electrostatic chucks or clamps may vary in design, they are based primarily on a principle of applying a voltage to one or more electrodes (not shown) embedded in the chuck 1004 so as to induce opposite polarity changes in the mask 1002 and the electrode(s), respectively. The electrostatic attractive force between the opposite charges pulls the mask 1002 against the chuck 1004, thereby retaining the mask in its position in a secure manner.

A typical electrostatic chuck or clamp includes an electrode covered by an insulator or dielectric layer. When the electrode of the chuck or clamp is electrically biased with respect to the mask by a voltage, an attractive electrostatic force is generated that holds the mask to the chuck. In bipolar electrode type chucks, the electrodes are electrically biased relative to one another to provide the electrostatic attractive force.

Figure 11:
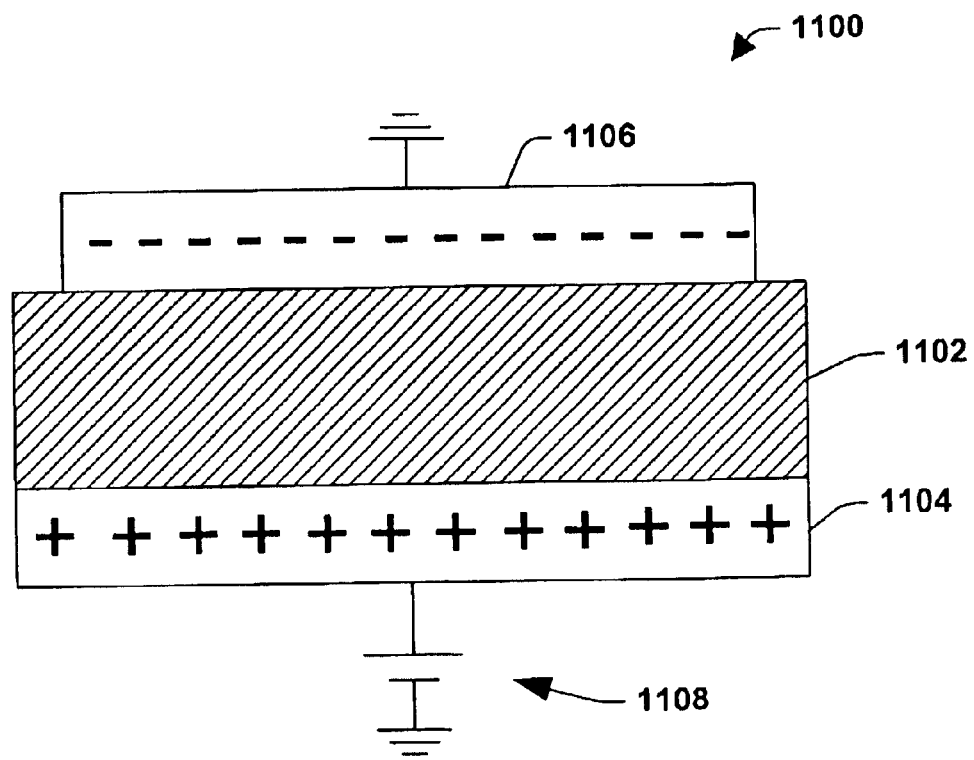
FIG. 11 is another cross-sectional side view of at least a portion of an EUV reflective mask wherein operation of electrostatic chucking is demonstrated.

By way of example, FIG. 11 illustrates in cross-sectional side view a depiction of an electrostatic clamp or chucking arrangement 1100, wherein a dielectric or insulating region 1102 overlies an electrode 1104. A workpiece 1106, for example, a reflective mask undergoing EUV irradiation, overlies the dielectric region or cover 1102. In operation, a voltage potential 1108 is applied across the mask 1106 via the electrode 1104. Due to the presence of the dielectric layer 1102 which exhibits a large electrical resistance, an accumulation of electrostatic charge in the mask 11106 and the electrode 1104 results in a coulombic electrostatic force characterized by the equation:

$$F = (\tfrac{1}{2}) \in_o \in_r A (V/t)^2,$$

wherein $\in_o$ and $\in_r$ are the dielectric constants associated with a vacuum and the dielectric layer 1102, respectively, A is the area of the electrode, V is the voltage applied to the electrode 1104 via the source 1108, and t is the thickness of the dielectric layer 1102. Another type of electrostatic clamp or chuck (not shown) employs Johnsen-Rahbek electrostatic attraction forces, which are a function of charge accumulation across an interfacial contact resistance such as an air gap. In any event, regardless of the particular type of clamp or chuck employed within a system, electrostatic forces work to secure the mask 1106 in position on the chuck without need of a mechanical or physical mechanism touching the mask.

Figure 12:
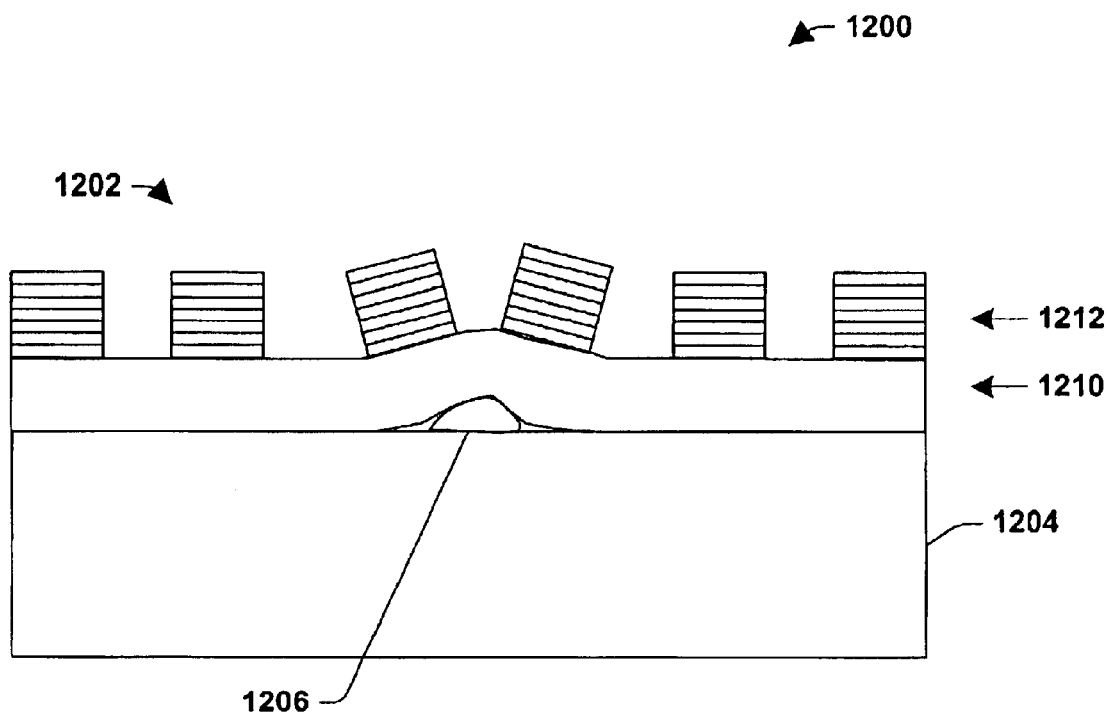
FIG. 12 is a cross-sectional side view of at least a portion of an EUV reflective mask situated within an electrostatic chucking arrangement wherein the effects of particle contamination are demonstrated.

Particulate contamination may, however, present issues in electrostatic clamping techniques. For example, FIG. 12 (not drawn to scale) illustrates an electrostatic clamping arrangement 1200 wherein an EUV reflective mask 1202 is electrostatically held on a flat chuck 1204. A particle 1206 that may become situated between respective upper and lower surfaces of the substantially smooth and uniform chuck 1204 and reticle 1202 can cause deformities in the mask 1202. Such distortions 1208 can be propagated up through a series of reflective 1210 and absorbing 1212 layers of the reticle 1202. Such an irregularity within the mask 1202 can interfere with the fidelity of pattern transfers. For example, absorber patterns on the mask can become displaced as the mask is distorted by the underlying particle 1206. A lateral displacement of a pattern or a local change in the slope at the top surface (or imaging surface) will result in a displacement, or distortion, of the image printed by a stepper. It will be appreciated that the size of the contaminant 1206 depicted in FIG. 12 may be exaggerated relative to the size (e.g., thickness) of the layers shown, and that disturbances on the order of a few nanometers or less can interfere with the fidelity of pattern transfers.

Figure 13:
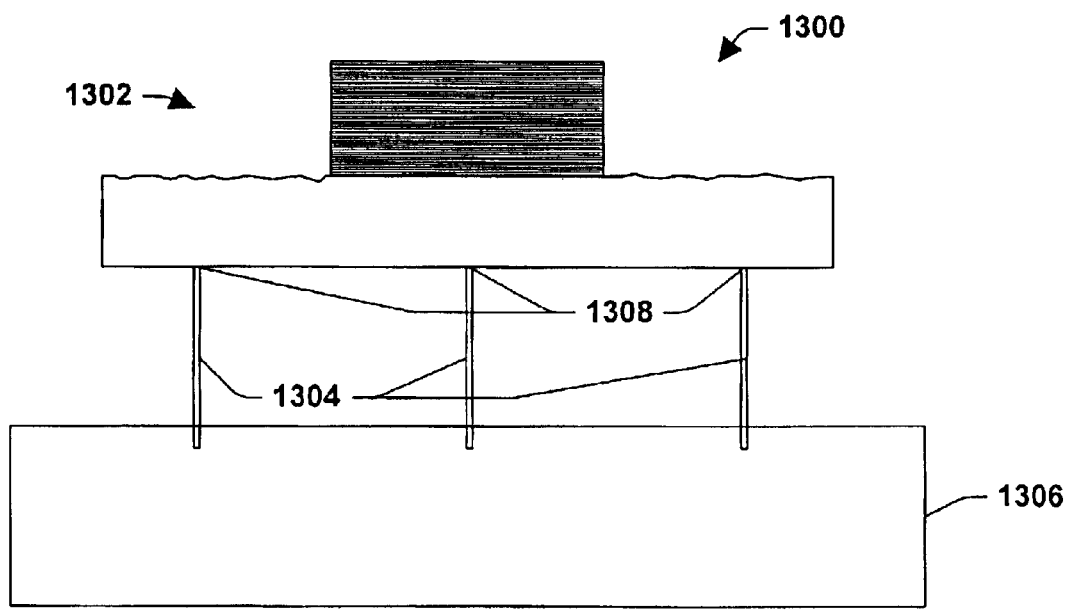
FIG. 13 is a cross-sectional side view of at least a portion of an EUV reflective mask situated within a pin chucking arrangement.

FIG. 13 illustrates an exemplary pin chucking arrangement 1300 for mounting an EUV reflective mask or reticle 1302, whereby the probability of particulate contamination highlighted above is reduced. In this configuration a plurality of lift pins 1304 (e.g., three) are operatively coupled to or integrated within a clamping plate or chuck 1306. Respective tips 1308 of the pins are operable to contact and support the mask 1302, and to vertically translate the mask 1302 between processing and loading positions, for example. By way of example, the mask may be elevated to about 1–2 mm above the clamping plate in a loading position.

The lift pins 1304 may, for example, comprise a plurality of pneumatically-actuated pins, wherein the plurality of pneumatically-actuated pins are operable to linearly translate with respect to the clamping plate 1306 when an actuation pressure (not shown) is induced in an actuator (not shown) associated with the plurality of lift pins 1304. The plurality of lift pins 1304 can, for example, be comprised of quartz, silicon carbide, and/or a ceramic material, and can have a generally small diameter (e.g., on the order of about 1 to 2 mm).

Figure 14:
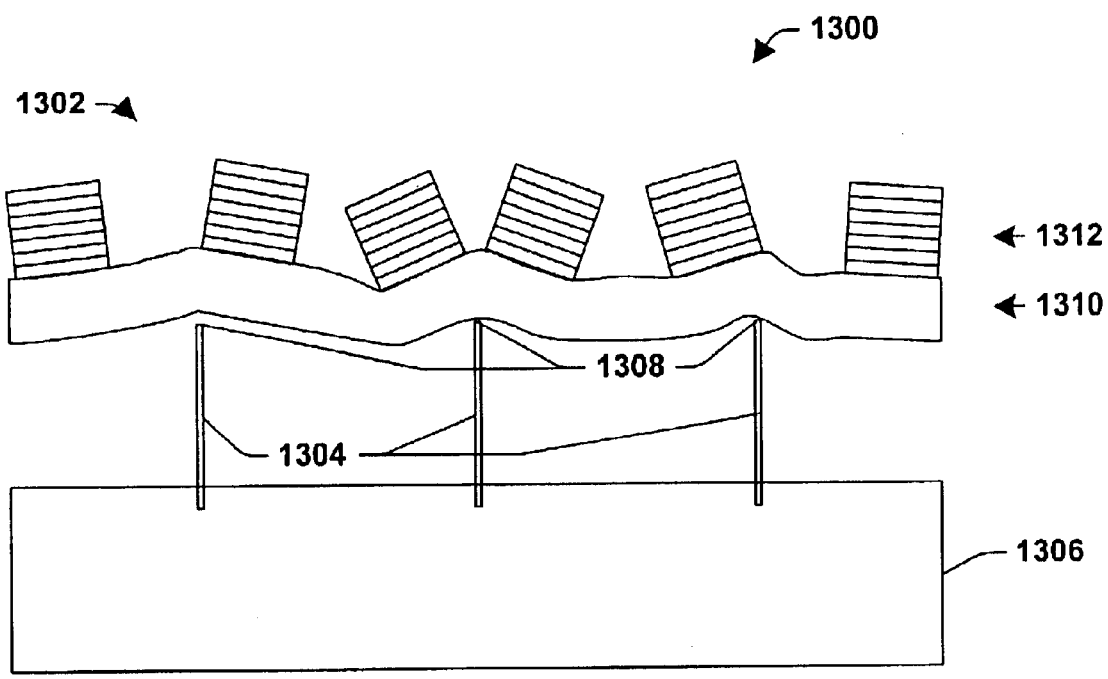
FIG. 14 is a cross-sectional side view of at least a portion of an EUV reflective mask situated within a pin chucking arrangement wherein the effects of heat induced warping are demonstrated.

Since a significantly reduced area of the mask 1302 is contacted by the pins 1304, particle contamination issues are virtually eliminated. However, such pin chucking arrangements 1300 may be susceptible to warping effects that result from a significant decrease in thermal conductance. Turning to FIG. 14, for example, a pin chucking arrangement 1300 similar to that depicted in FIG. 13 is illustrated wherein a mask has a series of reflective 1310 and absorbing 1312 layers that are drastically warped, and wherein absorber or reflective patterns formed therein are displaced. This may be due to heating of the mask from EUV radiation that encounters, but is not dissipated away from the mask 1302. Since very little surface area of the mask 1302 is in contact with the pins 1308 of the chucking arrangement, there is little opportunity for the heat generated in the mask to be conducted away. Additionally, since EUV masks are generally employed in a vacuum, no heat is dissipated by way of convection. Accordingly, the fidelity of pattern transfers can be adversely affected as EUV radiation directed at the mask may be reflected at unexpected and undesirable angles. It will be appreciated that the degree of warping depicted in FIG. 14 may be exaggerated for purposes of illustration, and that relatively minor distortions (e.g., on the order of about a few nanometers or less) can negatively impact the fidelity of pattern transfers.

Figure 15:
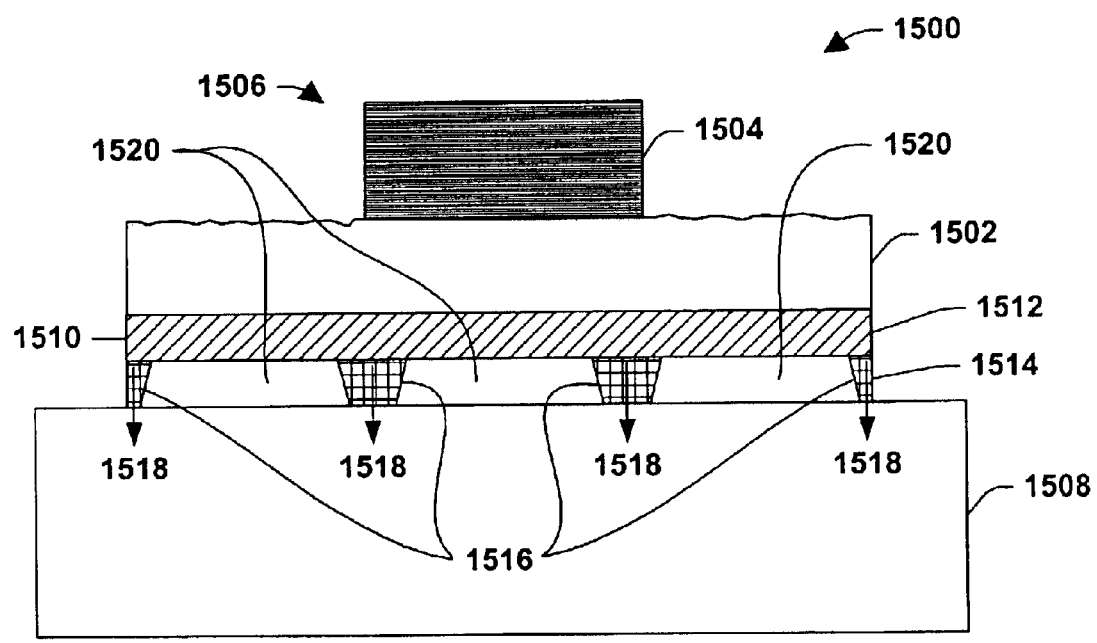
FIG. 15 is a cross-sectional side view of at least a portion of an EUV reflective mask fashioned according to one or more aspects of the present invention.

Referring now to FIG. 15, an EUV reflective mask or reticle 1500 fabricated according to one or more aspects of the present invention is depicted in cut-away side view. The mask facilitates EUV lithography in semiconductor fabrication processing while mitigating the probability for particle contamination and warping effects. The mask comprises a substrate 1502 and a reflective coating 1504 formed thereover with the reflective coating patterned to include a feature 1506 to be transferred onto a wafer (not shown). In this manner the mask 1500 resembles that depicted in FIG. 9. It will be appreciated, however, that one or more aspects of the present invention are equally applicable to other types of masks, such as that depicted in FIG. 8.

The mask 1500 is applicable to, for example, electrostatic chucking arrangements and is, accordingly, situated upon a flat chuck 1508. The mask includes a thermally conductive coating that conducts heat away from the mask while mitigating the opportunity for contaminants to become squeezed between the mask and the flat chuck 1508. In the example illustrated, the conductive coating comprises two layers of material that are applied to the backside 1510 of the mask. A first layer 1512 is formed onto the backside 1510 of the mask or a bottom surface of the substrate 1502, and a second layer 1514 is then formed onto the first layer 1512. Such layers can be formed onto the substrate in any suitable manner, such as via chemical vapor deposition (CVD) for example. The second layer has a plurality of thermally conductive pads 1516 formed therein that contact the flat chuck 1508 and support the mask 1500 upon the chuck. Heat is conducted away from the mask through the pads 1516 in the second layer 1514 as is illustrated by arrows 1518. Since the mask 1500 is typically implemented in a vacuum, no heat is dissipated away from the mask through apertures 1520, by way of convection. Such pads can be formed in any suitable manner, such as via etching, for example, to selectively remove material(s) to carve out the apertures.

Figure 16:
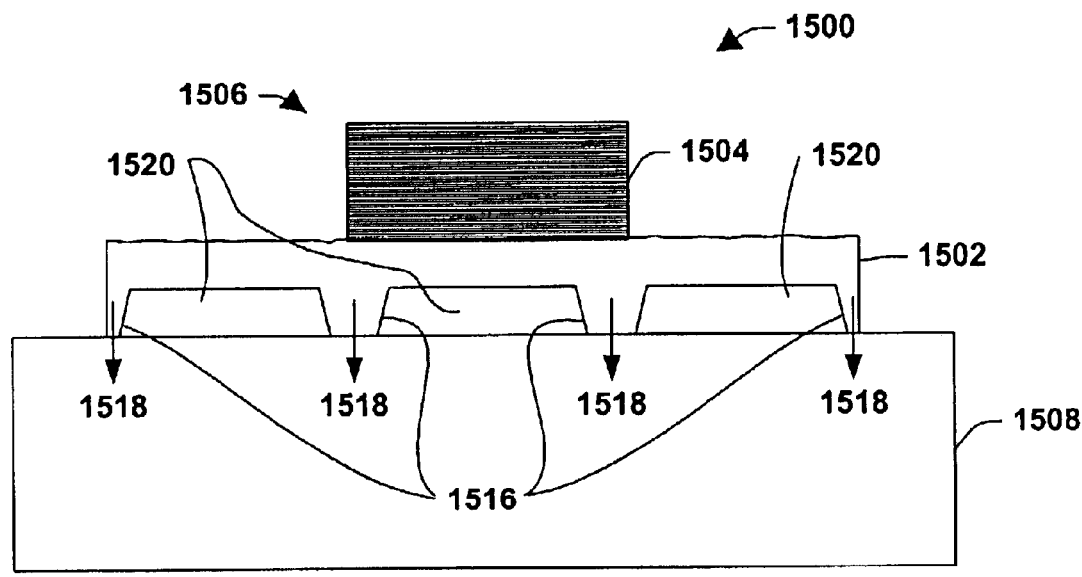
FIG. 16 is a cross-sectional side view of at least a portion of another EUV reflective mask fashioned according to one or more aspects of the present invention.

The layers 1512, 1514 are comprised of one or more materials that provide desired thermal conductance, and that exhibit desired electrical properties to facilitate electrostatic chucking. The layers can, for example, comprise chrome, among other things. It will be appreciated, however, that such materials and layers need not necessarily be applied for purposes of the present invention and/or that one or more layers need not be applied so as to completely cover the entirety of the flat chuck 1508. By way of example, should the substrate comprise one or more materials that exhibit desired thermally conductive and electrical properties and be of a sufficient quantity or thickness so as to accommodate thermally conductive pads, then such pads can be formed directly into the substrate without application of additional layers (e.g., layers 1512, 1514). Such a scenario is depicted in FIG. 16 wherein the thermally conductive pads 1516 are formed directly into at least a portion of the substrate 1502 and are of the same design as those depicted in FIG. 15.

It will be appreciated that the pads 1516 can be of any desired number and that the different pads can have any respective sizes, shapes and/or designs, provided that they afford a desired level of thermal conductivity, and a satisfactory mitigation of particle contamination. The number and/or configuration of the pads can, for example, be arrived at through empirical testing and/or though the utilization of thermal mechanical modeling techniques that may also consider and take into account electrical properties that facilitate electrostatic chucking. By way of example, where coverage of the chuck 1508 is reduced by virtue of the pads 1516 formed within the conductive layer, the resulting thermal conductivity may be approximated according to the following linear equation:

$$C \approx \alpha/100 * IC$$

where C is the resultant thermal conductivity, $\alpha$ is the percent of the chuck covered by the pads and IC is the initial conductivity of the mask when the chuck is entirely covered.

For instance, a 25% coverage may yield a conductivity of about 25 W/m$^2$K. The apertures in the backside of the EUV mask of the present invention advantageously reduce the amount of contact surface area between the mask and the chuck. Thus if the contact surface area is reduced by 75%, the chance that particulate contamination may locate under the mask contact areas in a manner to cause deformity is also reduced by 75%.

Figure 17:
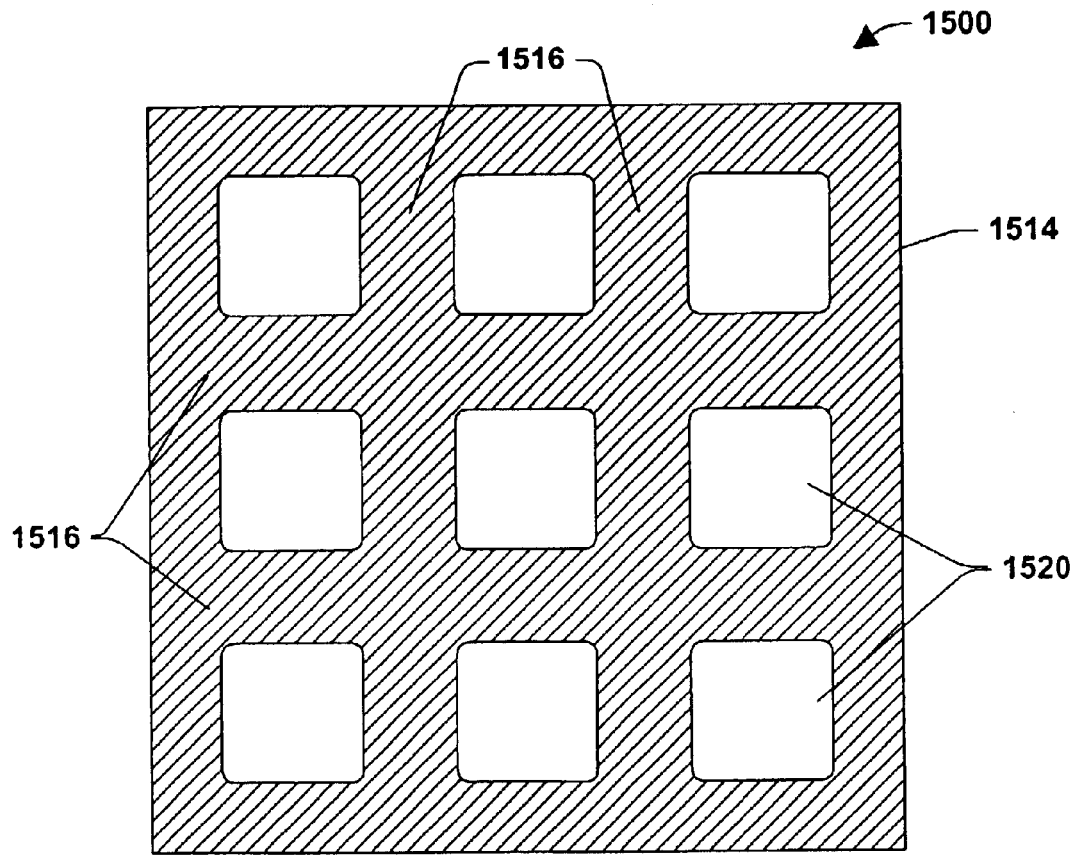
FIG. 17 is a bottom view of at least a portion of an EUV reflective mask, such as that depicted in FIG. 15, fashioned according to one or more aspects of the present invention.
Figure 18:
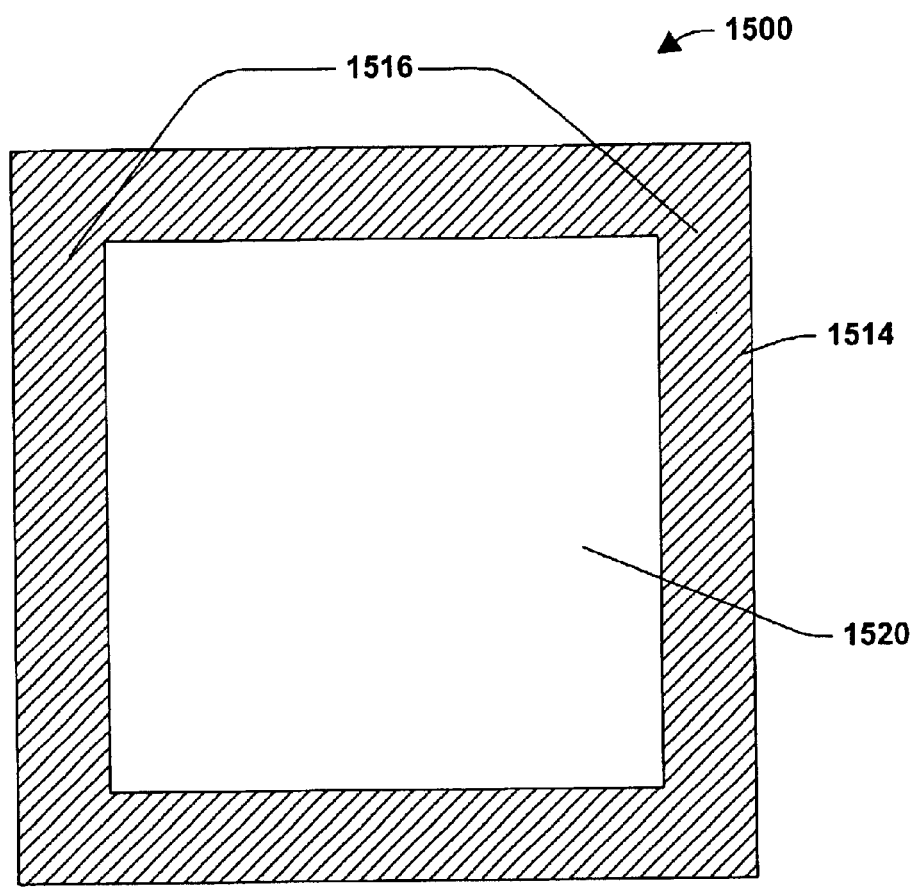
FIG. 18 is a bottom view of at least a portion of another EUV reflective mask fashioned according to one or more aspects of the present invention.
Figure 19:
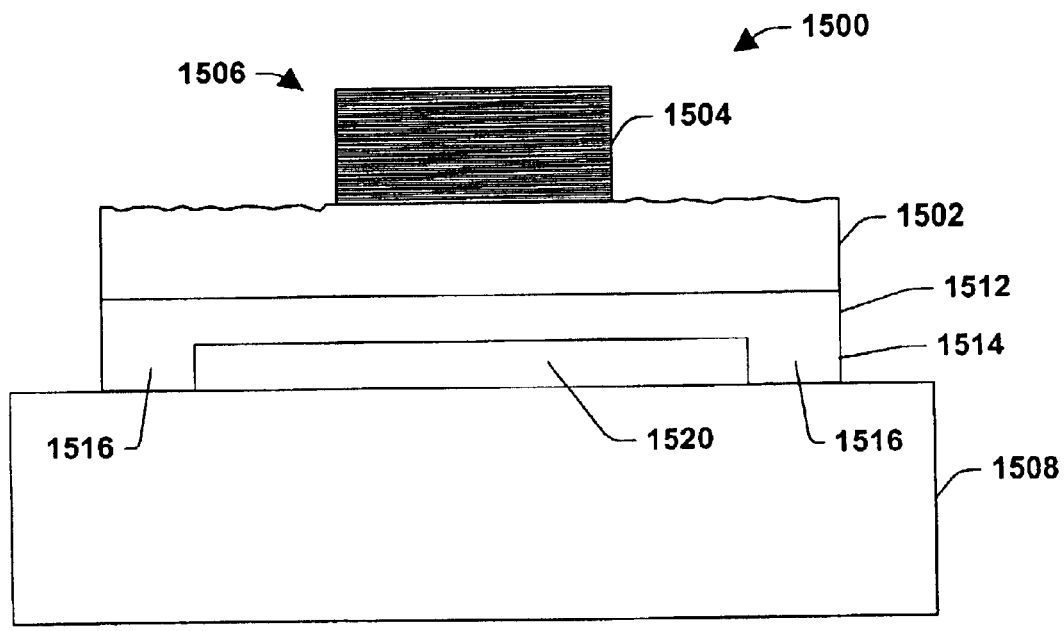
FIG. 19 is a cross-sectional side view of at least a portion of an EUV reflective mask, such as that depicted in FIG. 18, fashioned according to one or more aspects of the present invention.
Figure 20:
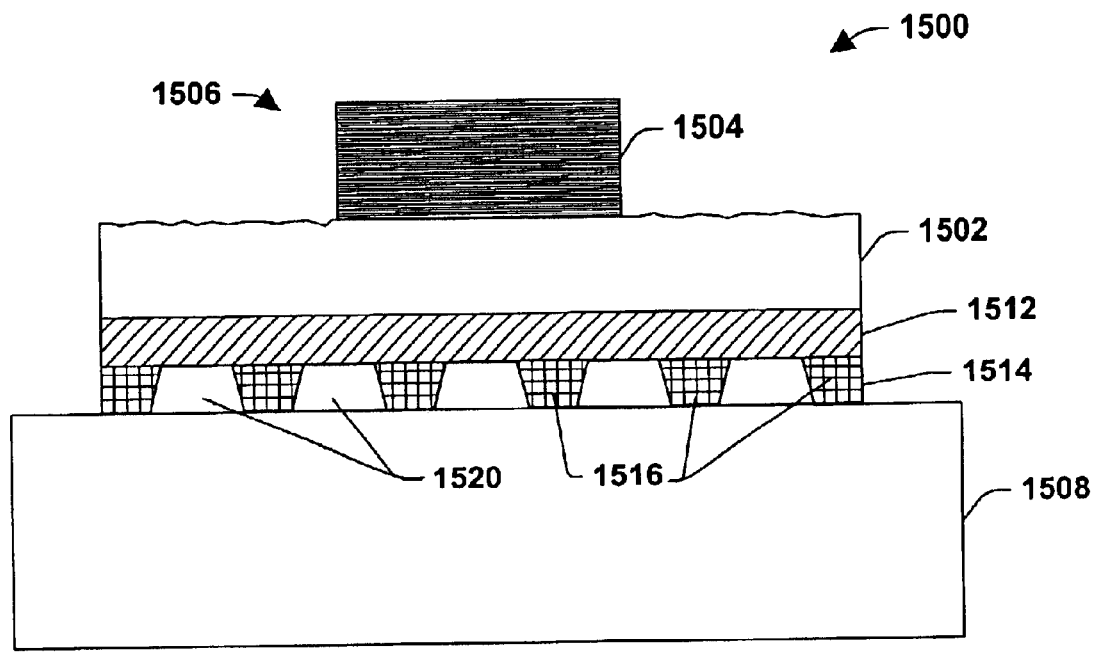
FIG. 20 is a cross-sectional side view of at least a portion of another EUV reflective mask fashioned according to one or more aspects of the present invention.
Figure 21:
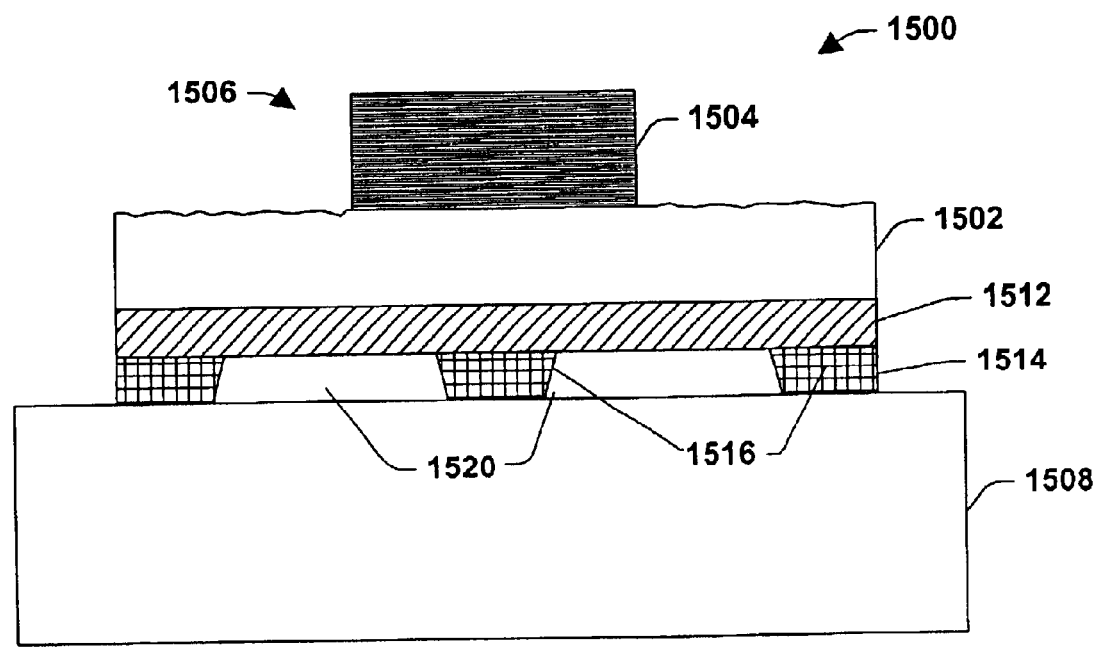
FIG. 21 is a cross-sectional side view of at least a portion of yet another EUV reflective mask fashioned in accordance with one or more aspects of the present invention.

FIG. 17 illustrates an exemplary bottom view of at least a portion of an EUV reflective mask 1500, such as that depicted in FIG. 15, fashioned according to one or more aspects of the present invention. In the exemplary configuration depicted in FIG. 17, nine apertures 1520 have been formed within the conductive layer 1514 to define the pads 1516. As previously mentioned, however, the present invention is not meant to be limited to any particular configuration, but rather contemplates configurations that afford desired thermal conductivity and mitigation of squeezed contaminants. By way of further example, FIG. 18 illustrates a bottom view of another exemplary EUV reflective mask 1500, wherein a single large aperture 1520 is formed within the conductive layer 1514 to define the conductive pads 1516. A cross-sectional view of the mask illustrated in FIG. 18 is depicted in FIG. 19. By way of still further example, FIG. 20 and FIG. 21 illustrate in respective cross sectional side views other exemplary masks 1500 according to one or more aspects of the present invention wherein the masks have a greater (FIG. 20) and lesser (FIG. 21) number of pads than that depicted in FIG. 15.

Figure 22:
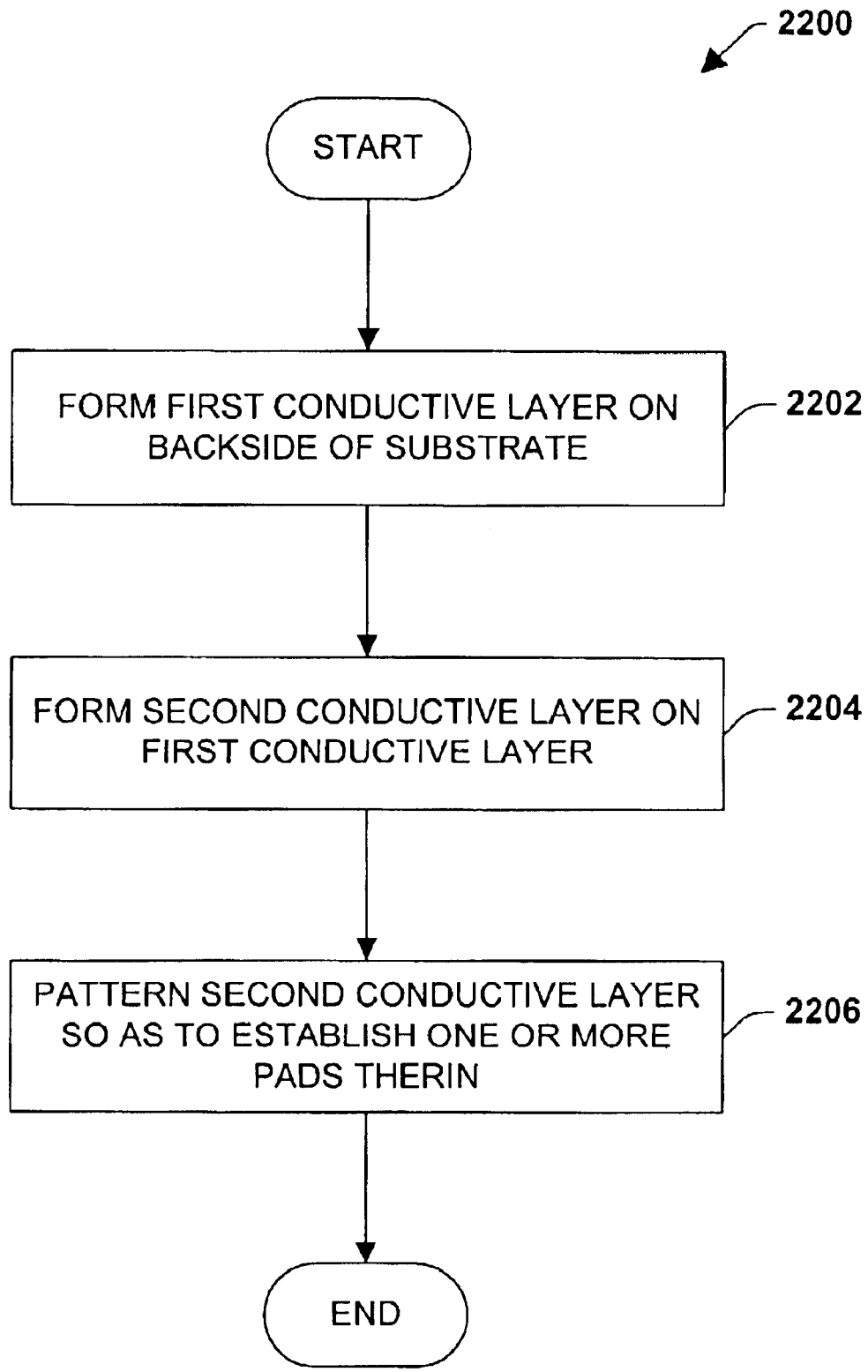
FIG. 22 is a flow diagram illustrating an exemplary methodology for fabricating a reflective mask in accordance with one or more aspects of the present invention.

Referring now to FIG. 22, an exemplary methodology 2200 is illustrated for fabricating a reflective mask in accordance with one or more aspects of the present invention. Although the methodology 2200 is illustrated and described hereinafter as a series of acts or events, it will be appreciated that the present invention is not limited by the illustrated ordering of such acts or events. For example, some acts may occur in different orders and/or concurrently with acts or events apart from those illustrated and/or described herein, in accordance with one or more aspects of the present invention. In addition, not all illustrated acts may be required to implement a methodology in accordance with the present invention. Furthermore, the methodologies according to the present invention may be implemented in association with the formation and/or processing of structures illustrated and described herein as well as in association With other structures not illustrated or described herein. In one example, the method or variants thereof may be used in the fabrication of a reflective mask, as illustrated and described below with respect to FIGS. 23–25.

The methodology begins at 2202 wherein a first layer of thermally conductive material is formed onto the backside of an EUV reflective mask or rather on a bottom surface of a substrate of the mask. The methodology then advances to 2204 wherein a second layer of thermally conductive material is formed onto the backside of the first layer of thermally conductive material. The layers can be formed in any suitable manner, such as via chemical vapor deposition (CVD), for example.

Then, at 2206 the second layer is patterned so as to establish one or more thermally conductive pads within the mask. The backside of the second layer can, for example, be etched so as to selectively remove material therefrom and create apertures within the mask which define the pads. The pads facilitate the thermal conductance of heat away from the mask, while the apertures mitigate the opportunity for contaminating particles to become lodged between the mask and a flat chuck upon which the mask can rest. The layers can also comprise, for example, one or more material(s) that exhibit, among other things, electrically conductive properties that allow the mask to be held in place during semiconductor processing via electrostatic chucking. The layers can include chrome, for example, among other things. The number of pads and the respective, shapes, sizes, etc. of the pads to be formed within the mask can be determined in any suitable manner, such as via empirical testing and/or through implementation of thermal mechanical modeling.

It will be appreciated that the ordering of the acts is not absolute and/or to be construed in a limiting sense and that one or more acts of the methodology can be carried out concurrently. For example, should the substrate comprise one or more materials that exhibit desired thermally conductive and electrical properties and be of a sufficient quantity or thickness so as to accommodate thermally conductive pads, then such pads can be formed directly into the substrate by forming one or more apertures therein without the need for additional layers.

Figure 23:
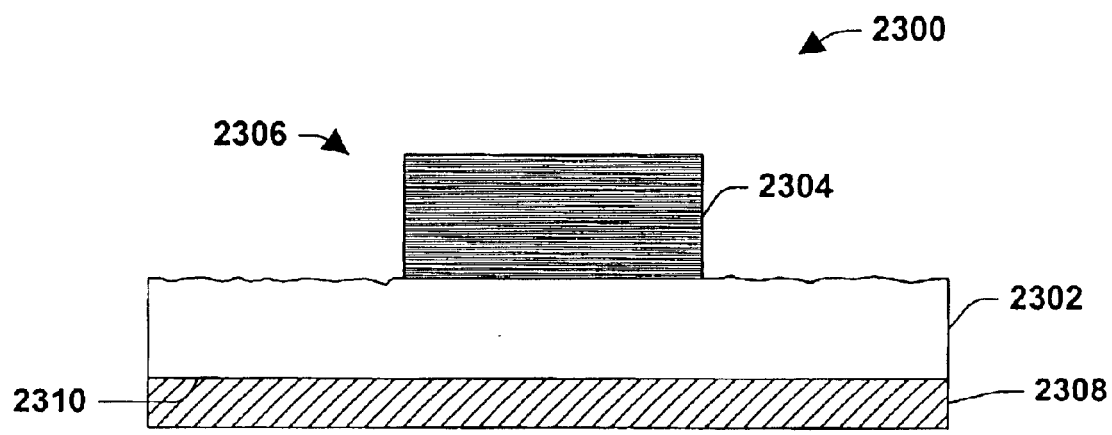
FIGS. 23–25 are cross-sectional illustrations demonstrating fashioning of an EUV reflective mask in accordance with one or more aspects of the present invention.
Figure 24:
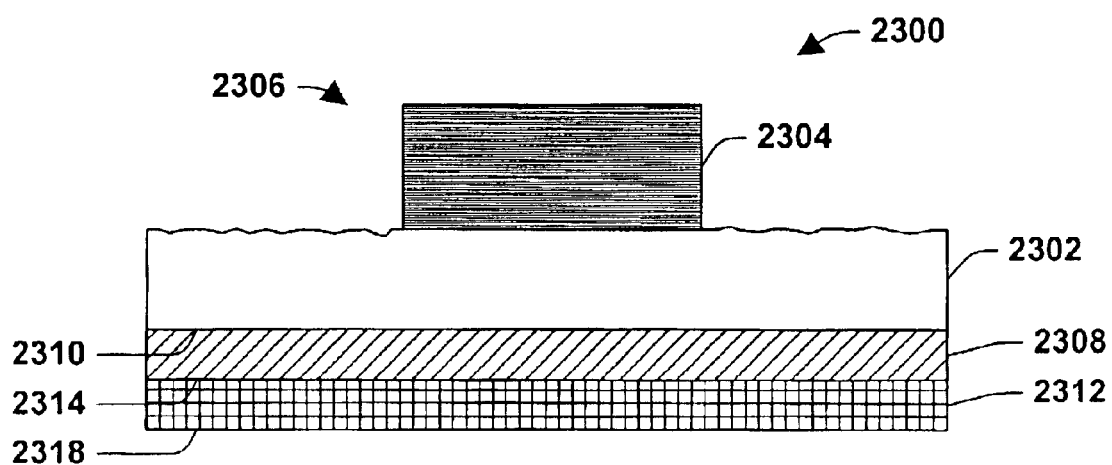
Figure 25:
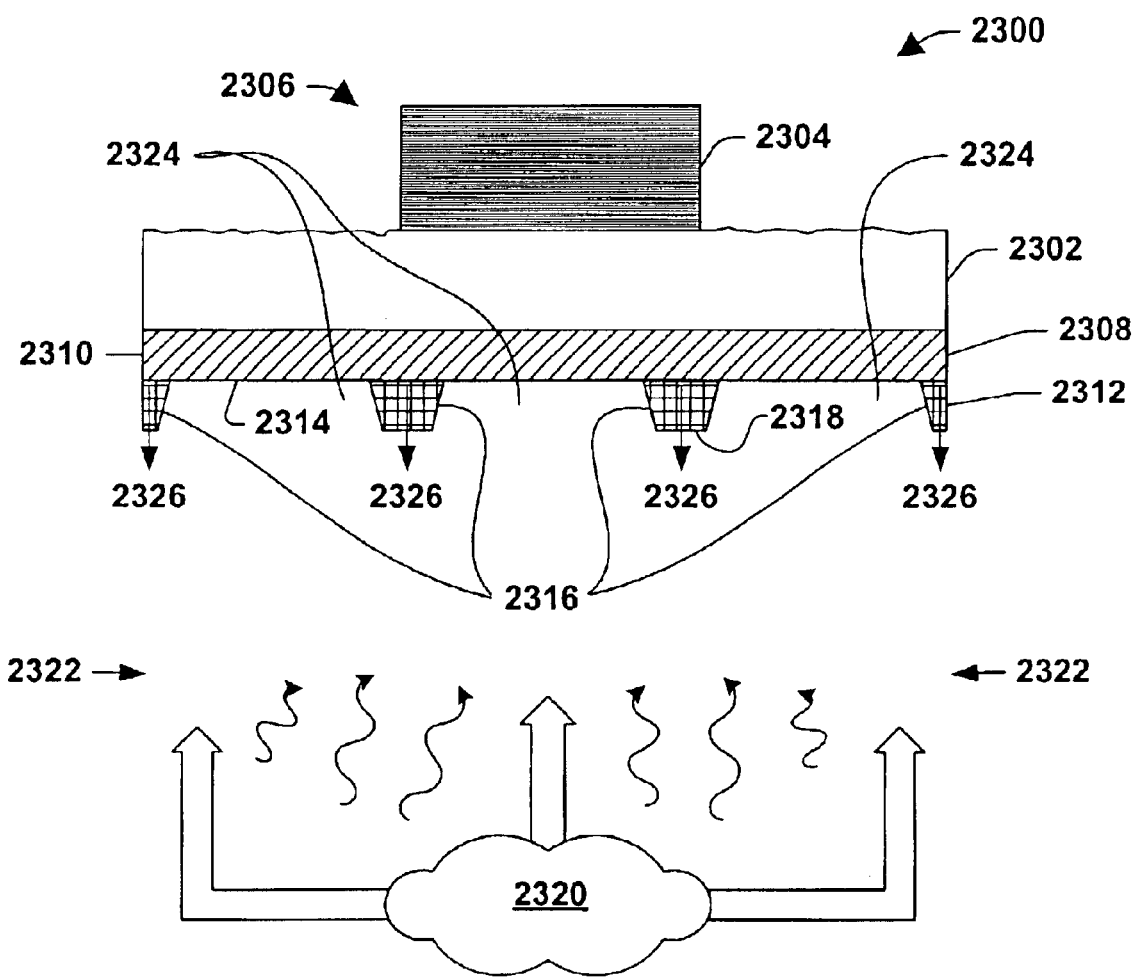

FIGS. 23–25 are cross-sectional illustrations of at least a portion of an EUV reflective mask or reticle 2300 depicting the fabrication of the mask in accordance with one or more aspects of the present invention. The mask comprises a substrate 2302 and a reflective coating 2304 formed thereover with the reflective coating patterned to include a feature 2306 to be transferred onto a wafer (not shown). In this manner the EUV reflective mask 2300 resembles that depicted in FIG. 9. It will be appreciated, however, that one or more aspects of the present invention are equally applicable to other types of masks, such as that depicted in FIG. 8.

FIG. 23 illustrates that a first layer 2308 of thermally conductive material is formed onto a backside 2310 of the EUV reflective mask 2300 or rather on a bottom surface of the substrate 2302 of the mask 2300. FIG. 24 similarly depicts the mask 2300, but illustrates that a second layer 2312 of thermally conductive material is formed onto a backside 2314 of the first layer 2308 of thermally conductive material. It will be appreciated that the layers 2308, 2312 can be formed in any suitable manner, such as via spin-on techniques, sputtering techniques and/or deposition techniques (e.g., chemical vapor deposition (CVD)).

Turning to FIG. 25, the second layer 2312 is patterned so as to establish one or more thermally conductive pads 2316 within the mask 2300. The second layer 2312, and more particularly a bottom or backside 2318 of the second layer 2312, can, for example, be exposed to an etchant 2320 during an etching process 2322 so as to have material selectively removed therefrom and create apertures 2324 within the mask 2300 which define the pads 2316. The pads 2316 facilitate conducting heat away from the mask 2300 (as indicated by arrows 2326) to mitigate warping, while the apertures 2324 mitigate the opportunity for contaminating particles to become lodged between the mask and a flat chuck (not shown) upon which the mask 2300 can rest. The layers can also comprise, for example, one or more material(s) that exhibit, among other things, electrically conductive properties that allow the mask to be held in place during semiconductor processing via electrostatic chucking. The layers can include, for example, chrome, among other elements. The number of pads and the respective, shapes, sizes, etc. of the pads to be formed within the mask can be determined in any suitable manner, such as via empirical testing and/or through implementing one or more thermal mechanical modeling techniques, for example.

It will be appreciated that one or more (or no) layers, such as layers 2308, 2312 are envisioned by the present invention, and that such layers may or may not cover the entirety of adjacent layers over which they are applied. For example, should the substrate comprise one or more materials that exhibit desired thermally conductive and electrical properties and be of a sufficient quantity or thickness so as to define thermally conductive pads, then such pads can be formed directly into the substrate by forming one or more apertures therein without the need for additional layers.

Accordingly, one may now appreciate that one or more aspects of the present invention provide a lithography mask or reticle that enhances the fidelity of pattern transfers by reducing the opportunity for contaminating particles to become wedged between the mask and a chuck upon which the mask may rest during semiconductor processing, and also by providing for adequate heat dissipation via thermal conductance to mitigate warping of the mask. One or more thermally conductive pads formed within one or more layers of the mask facilitate the thermal conductance of heat away from the mask, and spaces or apertures formed between the pads that effectively serve to define the pads facilitate the mitigation of particle contamination. Although the invention has been shown and described with respect to one or more implementations, equivalent alterations and modifications will occur based upon a reading and understanding of this specification and the annexed drawings.

The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of making a reflective lithography mask comprising:
    forming a first layer of thermally conductive material over a backside of a substrate of the reflective mask, wherein one or more features to be transferred onto a wafer are formed within one or more layers formed over a topside of the substrate;
    forming a second layer of thermally conductive material over the first layer of thermally conductive material; and
    forming one or more thermally conductive pads within the second layer of thermally conductive material.

2. The method of claim 1, wherein forming one or more thermally conductive pads comprises:
    forming one or more apertures within the second layer of thermally conductive material.

3. The method of claim 2, wherein forming one or more apertures within the second layer comprises:
    selectively removing some material of the second layer of thermally conductive material.

4. The method of claim 3, wherein the material is selectively removed via etching.

5. The method of claim 3, wherein the one or more apertures serve to define the one or more thermally conductive pads.

6. The method of claim 1, wherein the first layer comprises chrome.

7. The method of claim 1, wherein the second layer comprises chrome.

8. The method of claim 1, wherein the first and second layers are formed by at least one of spin-on, sputtering and deposition techniques.

9. The method of claim 1, wherein the first and second layers are formed by chemical vapor deposition.

10. The method of claim 1, wherein the one or more pads facilitate conducting heat away from the mask to mitigate warping of the mask.

11. The method of claim 2, wherein the apertures mitigate the opportunity for contaminating particles to become lodged between the mask and a flat chuck upon which the mask can rest.

12. The method of claim 1, wherein the first and second layers comprise one or more materials that exhibit electrically conductive properties that facilitate electrostatic chucking of the mask.

13. The method of claim 1, wherein at least one of the size, shape, number and configuration of pads is determined via at least one of empirical testing and through implementing one or more thermal mechanical modeling techniques.

14. The method of claim 1, wherein a thermal conductivity of the mask is approximated according to:

$$C \approx \alpha/100 * IC$$

where C is the resultant thermal conductivity, $\alpha$ is the percent of coverage by the pads and IC is the initial thermal conductivity prior to forming the pads.

15. A method of making a reflective lithography mask comprising:

forming one or more layers of a thermally conductive material over a backside of a substrate of the reflective mask, wherein one or more features to be transferred onto a wafer are formed within one or more layers formed over a topside of the substrate; and forming one or more thermally conductive pads within at least one of the layers of thermally conductive material.

16. The method of claim 15, wherein forming one or more thermally conductive pads comprises:

forming one or more apertures within at least one of the layers formed over the backside of the substrate.

17. The method of claim 15, wherein the one or more layers formed over the backside of the substrate comprise chrome.

18. The method of claim 15, wherein the one or more pads facilitate conducting heat away from the mask to mitigate warping of the mask.

19. The method of claim 16, wherein the apertures mitigate the opportunity for contaminating particles to become lodged between the mask and a flat chuck upon which the mask can rest.

20. The method of claim 15, wherein the one or more layers formed over the backside of the substrate comprise one or more materials that exhibit electrically conductive properties that facilitate electrostatic chucking of the mask.

21. A method of making a reflective lithography mask comprising:

forming one or more thermally conductive pads within a backside of a substrate of the reflective mask, wherein one or more features to be transferred onto a wafer are formed within one or more layers formed over a topside of the substrate, wherein the one or more pads facilitate conducting heat away from the mask to mitigate warping of the mask, wherein the pads are defined by one or more apertures formed within the backside of the substrate, and wherein the apertures mitigate the opportunity for contaminating particles to become lodged between the mask and a flat chuck upon which the mask can rest.

22. A reflective lithography mask comprising:

one or more layers of a thermally conductive material formed over a backside of a substrate of the reflective mask, wherein one or more features to be transferred onto a wafer are formed within one or more layers formed over a topside of the substrate; and one or more thermally conductive pads formed within at least one of the layers of thermally conductive material.

23. The mask of claim 22, wherein the one or more layers formed over the backside of the substrate comprise chrome.

24. The mask of claim 22, wherein the one or more pads facilitate conducting heat away from the mask to mitigate warping of the mask, and are defined by one or more apertures formed within at least one of the layers of thermally conductive material, and wherein the apertures mitigate the opportunity for contaminating particles to become lodged between the mask and a flat chuck upon which the mask can rest.

25. The mask of claim 22, wherein the one or more layers formed over the backside of the substrate comprise one or more materials that exhibit electrically conductive properties that facilitate electrostatic chucking of the mask.

26. A reflective lithography mask comprising:

a substrate, wherein one or more features to be transferred onto a wafer are formed within one or more layers formed over a topside of the substrate; and one or more thermally conductive pads formed within a backside of the substrate, wherein the one or more pads facilitate conducting heat away from the mask to mitigate warping of the mask, wherein the pads are defined by one or more apertures formed within the backside of the substrate, and wherein the apertures mitigate the opportunity for contaminating particles to become lodged between the mask and a flat chuck upon which the mask can rest.

* * * * *